United States Patent [19]
Desne

[11] Patent Number: 5,598,123
[45] Date of Patent: Jan. 28, 1997

[54] FILTER ARRANGEMENT FOR SUPPRESSING AN AC VOLTAGE SUPERPOSED ON A DC VOLTAGE PRESENT ACROSS POLES OF A DC VOLTAGE SOURCE

[75] Inventor: Jean-Pierre Desne, Charleroi, Belgium

[73] Assignee: Alcatel N.V., Rijswijk, Netherlands

[21] Appl. No.: 457,399

[22] Filed: Jun. 1, 1995

[30]    Foreign Application Priority Data

Jun. 3, 1994  [EP]  European Pat. Off. ............. 94201593

[51] Int. Cl.$^6$ .................................................. H03B 1/00
[52] U.S. Cl. ......................... 327/551; 327/552; 323/280
[58] Field of Search .......................... 323/280; 327/545, 327/551, 552, 553, 556–563

[56]           References Cited

U.S. PATENT DOCUMENTS

| | | | |
|---|---|---|---|
| 3,670,230 | 6/1972 | Rooney et al. | 321/10 |
| 3,710,148 | 1/1973 | Itoh | 327/552 |
| 4,156,838 | 5/1979 | Montague | 327/552 |
| 4,350,956 | 9/1982 | De Puy | 327/561 |
| 4,549,129 | 10/1985 | Hing et al. | 323/280 |
| 4,594,648 | 6/1986 | Gallios | 327/552 |
| 4,968,928 | 11/1990 | Heider | 323/280 |

FOREIGN PATENT DOCUMENTS

| | | |
|---|---|---|
| 0363602 | 4/1990 | European Pat. Off. . |
| 2348599 | 11/1977 | France . |

OTHER PUBLICATIONS

EDN Electrical Design News, vol. 35, No. 4, Feb. 1990, Newton, Massachusetts, U.S., pp. 177–180, XP99769, R. Burt et al, "Nonlinear Components Lower Settling Time Of Noise Reduction Filters".

*Primary Examiner*—Timothy P. Callahan
*Assistant Examiner*—Jeffrey Zweizig
*Attorney, Agent, or Firm*—Frishauf, Holtz, Goodman, Langer & Chick

[57]              ABSTRACT

A filter arrangement an AC voltage superposed on a DC voltage present across first (KO) and second (HO) poles of a DC voltage source. The arrangement includes between these first (KO) and second (HO) poles, a series coupling of a capacitance (C1) and an impedance (R5), and an amplifier arrangement (N1,C2,R2,C3,R3, C4,R4,D1,D2) that has an inverting input terminal which is coupled to the first pole (KO) and an output terminal which is coupled a the junction node of the capacitance (C1) and the impedance (R5).

20 Claims, 1 Drawing Sheet

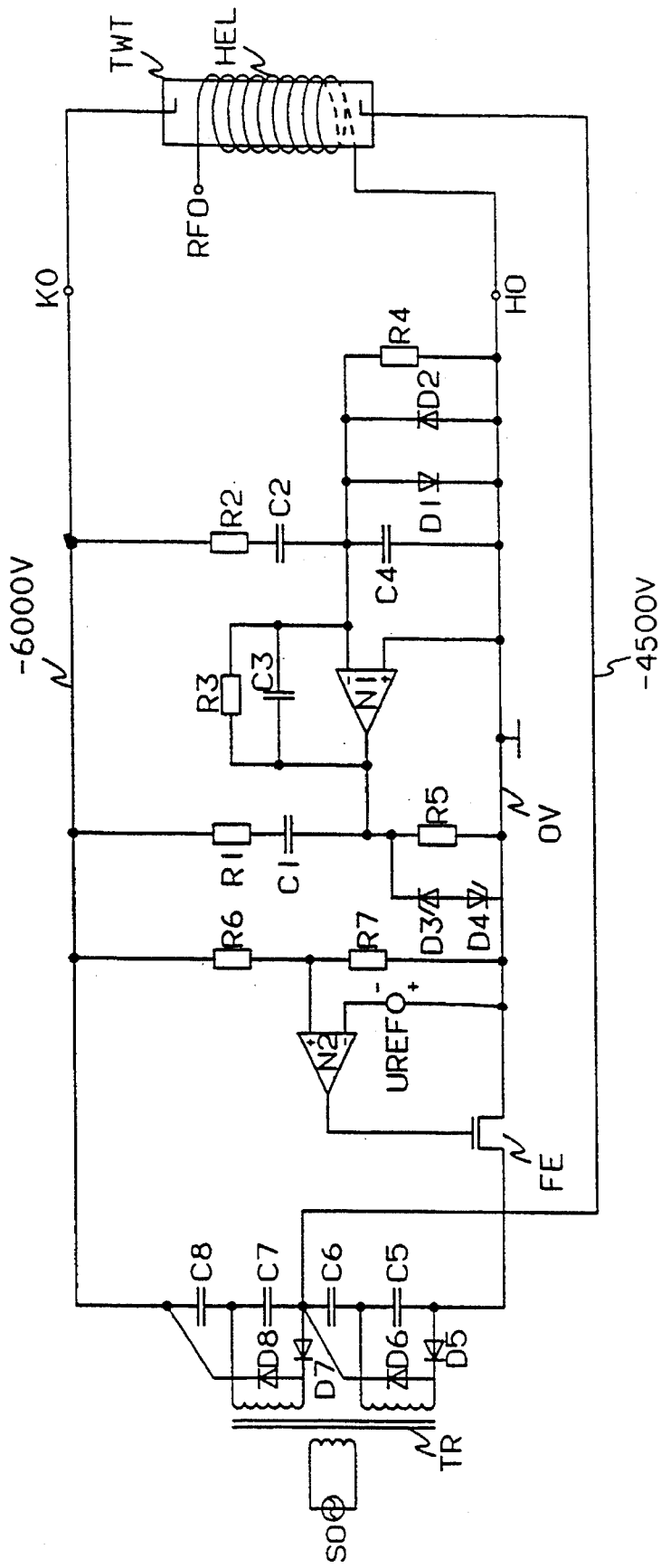

FILTER ARRANGEMENT FOR
SUPPRESSING AN AC VOLTAGE
SUPERPOSED ON A DC VOLTAGE PRESENT
ACROSS POLES OF A DC VOLTAGE
SOURCE

BACKGROUND OF THE INVENTION

1. Field of the Invention

The present invention relates to a filter arrangement for suppressing an AC voltage superposed on a DC voltage provided across first and second poles of a voltage source.

2. Description of the Prior Art

Such a filter arrangement is already known in the art, e.g. from the published European patent application EP 0363602A1. Therein, the voltage source includes a primary DC voltage source connected to the first and second poles via a series regulator regulating the DC voltage across these poles. This series regulator includes the series connection of a regulating transistor and a resistance between the primary DC voltage source and the first pole, and the regulating transistor is controlled so as to provide a predetermined voltage across the first and second poles. The filter arrangement includes a first capacitance which acts as a capacitive sensor for picking up from the second pole the AC voltage or noise voltage superposed on the DC voltage. This picked up AC voltage is then amplified by an operational amplifier providing a compensating voltage which is applied to the junction point between the regulating transistor and the resistance via a second capacitance preventing a DC voltage at the latter junction point from reaching the output of the operational amplifier. Thus, an active filter arrangement is obtained whose efficiency is determined by the values of the components used, i.e. mainly by the gain of the operational amplifier and the value of the resistance. Indeed, these values must be so chosen that the above compensating voltage is exactly opposite in phase and equal in amplitude to the AC voltage initially present at the junction point. This means that the filter arrangement is sensitive to variations of the values of these components.

To be noted that the operation of the above filter arrangement may also be appreciated from the fact that it is based on the insight that the operational amplifier injects at the above junction point an AC current which is equal in amplitude and opposite in phase to the AC current corresponding to the AC voltage superposed on the DC voltage present across the first and second poles. It may then also be appreciated that the amplitude of the AC current to be suppressed should be smaller than the DC current corresponding to the DC voltage in order to be able to effectively suppress it. When the DC voltage is applied to a so-called travelling wave tube (TWT) operating with a current which is typically equal to 0.1 milliampere (mA) to 1 mA whereas the AC current to be suppressed may well be equal to 1 mA to 2 mA, this AC current may thus not be effectively suppressed. Accordingly, in order to be able to be effectively suppressed the amplitude of the AC voltage to be suppressed should be relatively small.

An object of the present invention is to provide a filter arrangement of the above known type but which is less sensitive to variations of the values of its constituent components, and which puts no constraints on the amplitude of the AC voltage to be suppressed.

SUMMARY OF THE INVENTION

According to the invention, this object is achieved due to the fact that it includes between said first and second poles the series coupling of a capacitance and an impedance, and an amplifier arrangement with an inverting input coupled to said first pole and with an output coupled to the junction point of said capacitance and said impedance.

In this way, when the amplifier arrangement has a gain of algebraic value A and the capacitance has a value C, a variation dV of the AC voltage at the first pole is amplified by the amplifier arrangement and gives rise to a voltage variation equal to $(1-A) \times dV$ across the capacitance. As a consequence, the charge on the capacitance undergoes a variation equal to $C \times (1-A) \times dV$ so that the impedance value of this capacitance is divided by a factor $(1-A)$, i.e. the filter arrangement operates as a capacitance with a value equal to $C \times (1-A)$. A variation of the value of the capacitance or of the gain only causes the filter arrangement to operate as a capacitance with a somewhat modified value, but does not significantly change its efficiency. Furthermore, from the above it is clear that no constraints are put on the extent of variation of the voltage between the first and second poles, i.e. on the amplitude of the AC voltage to be suppressed.

By simulating a large value capacitance in the above way one avoids the drawbacks presented by a filter arrangement wherein one would connect a large value capacitance between the first and second poles. These drawbacks are the following: a large value capacitance is not only expensive, but has a large volume and weight which presents a problem particularly for its use in space and aircraft equipment. Moreover, such a capacitance is likely to have a large leakage resistance and this gives rise to unwanted power consumption and to the storage of a considerable amount of energy capable of affecting a load connected to the DC voltage source.

It is to be noted that a similar result may be provided in the prior art by an active filter with an active element through which the total output current flows and across which a voltage is developed, this active filter offering a low impedance between the first and second poles for AC signals and a high impedance between these poles for DC signals. However, one then has to deal with power consumption in the active element. Furthermore, when the DC voltage has a high value, the active elements must be designed to cope with such a high voltage.

Another characteristic feature of the present invention is that said amplifier arrangement includes a second capacitance coupled between its inverting input and said first pole.

Because the second capacitance uncouples the DC voltage from the amplifier arrangement, the value of the DC voltage is not limited by constraints of the amplifier arrangement which may therefore e.g. not be saturated.

A further feature of the present invention is that said amplifier arrangement includes a third capacitance coupled between its inverting input and its output.

As a consequence the amplifier arrangement has a gain whose absolute value is equal to the ratio of the values of the second and third capacitances. The third capacitance provides negative feedback and therefore contributes to a stable operation of the amplifier arrangement.

Still another feature of the present invention is that said amplifier arrangement includes a resistance coupled in parallel with said third capacitance.

Due to the DC bias provided by the resistance the operation of the amplifier arrangement is even more stable. It is to be noted however that this resistance reduces the gain of the amplifier arrangement at low frequencies.

Yet further features of the present invention are that said amplifier arrangement includes a second resistance coupled in series with said second capacitance between its inverting input and said first pole, and that said output of said amplifier arrangement is coupled to said first pole via the series connection of said first mentioned capacitance and a fourth resistance.

Thereby, the current flowing in the first and the second capacitance is limited so that damage of the amplifier arrangement is avoided.

An even further feature of the present invention is that said amplifier arrangement includes a fourth capacitance coupled between its inverting input and a second one of said poles.

By the series coupling of the second and fourth capacitances high frequency AC voltages, e.g. AC voltages whose frequency lies above a passband of the amplifier arrangement, are filtered, i.e. suppressed.

A still further characteristic of the present invention is that said amplifier arrangement includes a third resistance coupled in parallel with said fourth capacitance.

Thereby, DC voltage components on the inverting input of the amplifier arrangement are suppressed.

BRIEF DESCRIPTION OF THE DRAWING

The above mentioned and other objects and features of the invention will become more apparent and the invention itself will be best understood by referring to the following description of an embodiment taken in conjunction with the single accompanying drawing which represents a DC voltage source with an associated filter arrangement according to the invention and supplying power to a travelling wave tube TWT.

DETAILED DESCRIPTION

The DC voltage source includes an AC voltage source SO connected across the primary winding of a transformer TR. TR has two secondary windings each connected to a voltage doubler which as known in the art are built from diodes D5 and D6 and capacitances C5 and C6, and from diodes D7 and D8 and capacitances C7 and C8, respectively. The outputs of the voltage doublers are connected in series and thus provide first, second and third voltages approximately equal to 0 volts, −4500 volts and −6000 volts, respectively. Via a regulating transistor FE of a series regulator the first voltage is applied to an output pole HO of the DC voltage source, HO being also coupled to an input pole of a helical winding HEL of the travelling wave tube TWT. The intermediate voltage is applied to an anode of TWT and the negative voltage is applied to an output pole KO of the DC voltage source, KO being also connected to a cathode of TWT. The helical winding HEL furthermore has an output pole RFO. To be noted that the output pole HO is grounded and that with respect to this ground the voltages at the cathode and anode of TWT are equal to −6000 volts and −4500 volts, respectively. These voltages depend on the power requirements of the travelling wave tube TWT and the frequency bad in which it operates.

It should be noted that in a more general case the voltage doubler may be substituted by a rectifier bridge or a multiplier and that the transformer TR may have a plurality of secondary windings each connected to such a rectifier bridge or multiplier whose outputs are then connected in series so that a plurality of voltages is obtained each of which may be used for feeding additional not shown electrodes of the travelling wave tube TWT.

The series regulator includes between the output poles KO and HO the series connection of resistances R6 and R7 the junction point of which is connected to the not-inverting input of an operational amplifier N2 whose inverting input is coupled to the output pole HO via a reference voltage source UREF which provides a like named reference voltage and is biased as shown. The output of the operational amplifier N2 is connected to the gate of the regulating transistor FE which is a N-channel field effect transistor whose source is connected to the output pole HO and whose drain is connected to an output of one of the above voltage doublers.

The filter arrangement includes between the output poles KO and HO the series connection of a resistance R1, a capacitance C1 and a resistance R5 which is shunted by the series connection of two oppositely poled zener diodes D3 and D4. It further includes between KO and HO the series connection of a resistance R2, a capacitance C2 and a capacitance C4 which is shunted by antiparallel (oppositely poled) connection of diodes D1 and D2, and by a resistance R4. The junction point of capacitances C2 and C4 is connected to the inverting input of an operational amplifier N1 whose non-inverting input is connected to the output pole HO and whose output is connected to the junction point of capacitance C1 and resistance R5. The output of N1 is furthermore coupled to its inverting input via the parallel feedback connection of a capacitance C3 and a resistance R3.

The operation of the DC voltage source is now described hereinafter.

The AC voltage source SO provides an AC voltage which by the transformer TR is transformed to second AC voltages appearing across the secondary windings of TR. These second AC voltages are then applied to respective ones of the voltage doublers, the output voltages of which are put in series whereby three output voltages approximately equal to 0 volts, −4500 volts and −6000 volts respectively are obtained. It is to be noted that all voltages are referred to with respect to the output pole HO which is grounded and is at 0 volts.

The value of the voltage between the output poles HO and KO is regulated by the series regulator as follows. When this voltage exceeds $$-UREF \times \frac{R6+R7}{R7}$$

(when it increases e.g. from its required value of −6000 volts to −5950 volts) then the voltage at the output of the operational amplifier N2 rises whereby the conductivity of the drain-to-source path of transistor FE increases and the voltage at output pole KO drops (back to −6000 volts). Similarly, when the voltage at KO is lower than $$-UREF \times \frac{R6+R7}{R7}$$

then the output of N2 is low whereby FE becomes less conductive and the voltage at KO increases. Thus, by choosing the value of R7 for instance a thousand times larger than R6, a voltage UREF equal to 6 volts will cause the voltage at output pole KO to be regulated to approximately −6000 volts.

Due to the limited bandwidth of the series regulator and due to parasitic capacitive coupling across this series regulator a small AC voltage is superposed on the DC voltage provided across output poles KO and HO. The parasitic capacitive coupling occurs between the primary and secondary windings of transformer TR mutually and with respect to ground, i.e. pole HO, and also between both the output pole KO, i.e. the cathode of TWT, and the anode of the travelling wave tube TWT, and pole HO, i.e. ground. This parasitic capacitive coupling causes a parasitic current to be injected at pole HO this giving rise to at least part of the above small AC voltage. This AC voltage is suppressed by the filter arrangement as follows.

The filter arrangement operates as a virtual capacitance having a large capacitance value but storing only a small amount of energy. As is known in the art, a large capacitance value gives rise to an effective suppression of a parasitic AC voltage by providing a low AC impedance between the poles across which this voltage is present.

The capacitance value of the virtual capacitance may be calculated as follows. When the voltage between the poles KO and HO increases with an amount dV this increase in voltage is amplified by the operational amplifier N1 by a factor A so that the voltage across the series connection of R1 and C1 increases with $(1-A) \times dV$, i.e. the voltage across C1 is increased therewith. Indeed, the resistance R1 is provided in order to limit the current through capacitance C1 and may be given such a low value that it is negligible with respect to the impedance of C1. Resistance R5 provides a DC load for the output of operational amplifier N1 and the voltage across it is limited by diodes D3 and D4. As a consequence, the AC voltage between poles KO and HO nearly completely appears across capacitance C1. Thus, the charge on the capacitance C1 undergoes a variation $dQp = C1 \times (1-A) \times dV$, and this corresponds to a current $$Ip = \frac{dQp}{dt}$$

and to a capacitance value equal to $C1 \times (1-A)$. Thereby, the capacitance value of the virtual capacitance constituted by the filter arrangement is approximately equal to $$C1 \times (1-A) + \frac{C2 \times C4}{C2 + C4} .$$

The gain or amplification factor A provided by operational amplifier N1 is approximately equal to $$A = -\frac{Z3}{Z2} ,$$

where Z2 is the impedance of the series connection of R2 and C2, and Z3 is the impedance of the shunt connection of R3 and C3. As the resistance R2 is only provided to limit the current through capacitance C2, it may be given such a low value that the impedance Z2 is approximately equal to the impedance of C2. Similarly, since the resistance R3 is only provided for DC biasing operational amplifier N1 thereby stabilizing it's operation, its value may be made so high that the impedance Z3 is approximately equal to the impedance of C3. Thus, the gain is approximately equal to $$A = -\frac{C2}{C3} .$$

Due to resistance R3 in parallel with capacitance C3, the bandwidth of operational amplifier N1 is limited at lower frequencies and its gain has a so-called 3 dB frequency $\omega_{3dB}$ of approximately $$\frac{1}{R3 \times C3} .$$

At higher frequencies the bandwidth of the amplifier arrangement is limited because of bandwidth limitations of the operational amplifier N1. Higher frequency AC voltages are however still suppressed due to a low high frequency impedance offered by the series connection of C2 and C4.

The purpose of resistance R4 is to suppress a possible DC voltage present at the inverting input of N1. D1/D2 and D3/D4 limit the voltage across C4 and R5, respectively, as already mentioned above, and thus also provide a protection against excessive voltages at the input, and output of N1.

The operation of the travelling wave tube TWT being no object of the invention, it is not discussed here.

While the principles of the invention have been described above in connection with specific apparatus, it is to be clearly understood that this description is made only by way of example and not as a limitation on the scope of the invention.

I claim:

1. A filter arrangement for suppressing an AC voltage superposed on a DC voltage provided across first (KO) and second (HO) poles of a voltage source, comprising:

a series coupling of a first capacitance (C1) and an impedance (R5), the series coupling being coupled between the first (KO) and the second (HO) poles of said voltage source, voltage limiting means (D3, D4) coupled to the impedance (R5) and adapted to limit a voltage across the impedance (R5); and an amplifier arrangement (N1, C2, R2, C3, R3, C4, R4, D1, D2) having an inverting input coupled to said first pole (KO) of said voltage source, and an output coupled to a junction point of said first capacitance (C1) and said impedance (R5), said impedance (R5) being connected as a load for the amplifier arrangement.

2. The filter arrangement according to claim 1, wherein said amplifier arrangement (N1, C2, R2, C3, R3, C4, R4, D1, D2) includes:

an amplifier having said inverting input and said output; and a second capacitance (C2) coupling said inverting input of said amplifier to said first pole (KO) of said voltage source.

3. The filter arrangement according to claim 2, wherein said amplifier arrangement (N1, C2, R2, C3, R3, C4, R4, D1, D2) further includes a third capacitance (C3) coupled between said inverting input and said output of said amplifier.

4. The filter arrangement according to claim 3, wherein said amplifier arrangement (N1, C2, R2, C3, R3, C4, R4, D1, D2) further includes a first resistance (R3) coupled in parallel with said third capacitance (c3).

5. The filter arrangement according to claim 2, wherein said amplifier arrangement (N1, C2, R2, C3, R3, C4, R4, D1, D2) further includes a second resistance (R2) coupled in series with said second capacitance (C2) and between said inverting input of said amplifier and said first pole (KO) of said voltage source.

6. The filter arrangement according to claim 2, wherein said amplifier arrangement (N1, C2, R2, C3, R3, C4, R4, D1, D2) further includes another capacitance (C4) coupled between said inverting input of said amplifier and said second pole (HO) of said voltage source.

7. The filter arrangement according to claim 6, wherein said amplifier arrangement (N1, C2, R2, C3, R3, C4, R4, D1, D2) further includes a further resistance (R4) coupled in parallel with said another capacitance (C4).

8. The filter arrangement according to claim 7, wherein said amplifier arrangement (N1, C2, R2, C3, R3, C4, R4, D1, D2) further includes a pair of diodes (D1, D2) each coupled in parallel with said another capacitance (C4) and said further resistance (R4), said diodes being oppositely poled.

9. The filter arrangement according to claim 2, wherein said amplifier comprises an operational amplifier.

10. The filter arrangement according to claim 2, wherein said impedance (R5) comprises a resistance.

11. The filter arrangement according to claim 1, wherein said output of said amplifier arrangement (N1, C2, R2, C3, R3, C4, R4, D1, D2) is coupled to said first pole (KO) of said voltage source via a series connection of said first capacitance (C1) and another resistance (R1).

12. The filter arrangement according to claim 1, wherein said amplifier arrangement (N1, C2, R2, C3, R3, C4, R4, D1, D2) includes a another capacitance (C4) coupled between said inverting input of said amplifier arrangement and said second pole (HO) of said voltage source.

13. The filter arrangement according to claim 12, wherein said amplifier arrangement (N1, C2, R2, C3, R3, C4, R4, D1, D2) further includes a further resistance (R4) coupled in parallel with said another capacitance (C4).

14. The filter arrangement according to claim 13, wherein said amplifier arrangement (N1, C2, R2, C3, R3, C4, R4, D1, D2) further includes a pair of diodes (D1, D2) each coupled in parallel with said another capacitance (C4) and said further resistance (R4), said diodes being oppositely poled.

15. The filter arrangement according to claim 1, wherein the series coupling further includes a resistance (R1) coupled between said first capacitance (C1) and said first pole (KO) of said voltage source.

16. The filter arrangement according to claim 1, wherein said voltage limiting means (D3, D4) coupled to said impedance (R5) comprises a series connection of two oppositely poled diodes, said voltage limiting means being coupled to be in parallel with said impedance (R5).

17. The filter arrangement according to claim 16, wherein said oppositely poled diodes are each zener diodes.

18. The filter arrangement according to claim 17, wherein said impedance (R5) comprises a resistance.

19. The filter arrangement according to claim 16, wherein said impedance (R5) comprises a resistance.

20. The filter arrangement according to claim 1, wherein said impedance (R5) comprises a resistance.

* * * * *